(12) United States Patent
Pasch et al.

(10) Patent No.: US 6,486,056 B2
(45) Date of Patent: Nov. 26, 2002

(54) PROCESS FOR MAKING INTEGRATED CIRCUIT STRUCTURE WITH THIN DIELECTRIC BETWEEN AT LEAST LOCAL INTERCONNECT LEVEL AND FIRST METAL INTERCONNECT LEVEL

(75) Inventors: Nicholas F. Pasch, Pacifica, CA (US); Rajat Rakkhit, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/790,821

(22) Filed: Feb. 22, 2001

(65) Prior Publication Data

US 2001/0005057 A1 Jun. 28, 2001

Related U.S. Application Data

(62) Division of application No. 09/081,403, filed on May 18, 1998, now Pat. No. 6,239,491.

(51) Int. Cl.$^7$ ........................................... H01L 21/4763
(52) U.S. Cl. .................. 438/622; 438/631; 438/645; 438/666; 438/669; 438/672
(58) Field of Search ................................ 438/622, 631, 438/645, 666, 669, 672, 624

(56) References Cited

U.S. PATENT DOCUMENTS 5,393,712 A    2/1995  Rostoker et al. ............ 437/238
5,470,801 A   11/1995  Kapoor et al. ............... 437/238

(List continued on next page.)

FOREIGN PATENT DOCUMENTS

JP    1133354    *  5/1989

Primary Examiner—Eddie Lee
Assistant Examiner—Paul E Brock, II

(57) ABSTRACT

An integrated circuit structure is provided with a local interconnect layer and a first metal interconnect layer which are both capable of bridging over underlying conductive regions. The structure comprises a first dielectric layer formed to a height or thickness equal to or preferably exceeding the height of the highest conductive regions of the underlying integrated circuit devices; a second dielectric layer formed above the first dielectric layer; one or more local interconnects formed in the second dielectric layer; and a thin third dielectric layer formed over the second dielectric layer and the local interconnects therein. The thin third dielectric layer has a thickness not exceeding about 2000 Å, and preferably ranging from about 1000 Å to about 1500 Å. A first layer of metal interconnects is formed over the thin third dielectric layer. Conventionally formed filled contact openings extend from the substrate through the first dielectric layer to either filled vias or a local interconnect in the second dielectric layer. The metal interconnects are electrically connected to either filled vias or one or more local interconnects in the second dielectric layer by filled shallow vias in the thin third dielectric layer. The shallow vias in the thin third dielectric layer are preferably filled with the same metals used to form the first layer of metal interconnects.

6 Claims, 3 Drawing Sheets

U.S. PATENT DOCUMENTS

| | | | |
|---|---|---|---|
| 5,495,117 A | 2/1996 | Larson | 257/295 |
| 5,554,867 A | 9/1996 | Ajika et al. | 257/314 |
| 5,591,673 A | 1/1997 | Chao et al. | 437/192 |
| 5,598,026 A | 1/1997 | Kapoor et al. | 257/634 |
| 5,639,692 A | 6/1997 | Teong | 437/195 |
| 5,759,906 A | 6/1998 | Lou | 438/623 |
| 5,767,012 A | 6/1998 | Fulford, Jr. et al. | 438/622 |
| 5,798,568 A | 8/1998 | Abercrombie et al. | 257/758 |
| 5,801,093 A | 9/1998 | Lin | 438/624 |
| 5,801,419 A | 9/1998 | Zommer | 257/341 |
| 5,837,557 A | 11/1998 | Fulford, Jr. et al. | 438/6 |
| 5,840,624 A | 11/1998 | Jang et al. | 438/624 |
| 5,850,102 A * | 12/1998 | Matsuno | 257/635 |
| 5,858,869 A | 1/1999 | Chen et al. | 438/597 |
| 5,866,923 A | 2/1999 | Yokota | 257/204 |
| 5,869,149 A | 2/1999 | Denison et al. | 427/579 |
| 5,882,983 A | 3/1999 | Gardner et al. | 438/424 |
| 5,886,388 A | 3/1999 | Wada et al. | 257/393 |
| 5,892,249 A | 4/1999 | Courtright et al. | 257/209 |
| 5,900,668 A | 5/1999 | Wollesen | 257/522 |
| 5,929,525 A * | 7/1999 | Lin | 257/758 |
| 5,943,598 A | 8/1999 | Lin | 438/618 |
| 5,950,102 A * | 9/1999 | Lee | 438/619 |
| 5,970,375 A | 10/1999 | Gardner et al. | 438/637 |
| 6,107,189 A | 8/2000 | Wald et al. | 438/637 |

* cited by examiner

PROCESS FOR MAKING INTEGRATED CIRCUIT STRUCTURE WITH THIN DIELECTRIC BETWEEN AT LEAST LOCAL INTERCONNECT LEVEL AND FIRST METAL INTERCONNECT LEVEL

CROSS REFERENCE TO RELATED APPLICATION

This application is a division of U.S. patent application Ser. No. 09/081,403; filed May 18, 1998 now U.S. Pat. No. 6,239,491.

BACKGROUND OF THE INVENTION

1. Field of the Invention

This invention relates to integrated circuit structures having local interconnects. More particularly, this invention relates to an integrated circuit structure wherein a local interconnect level is separated from both the underlying substrate and the overlying first metal interconnect level in a manner which permits both the local interconnect level and the first metal interconnect level to bridge over underlying electrically conductive regions without any undue increase in either the capacitance of the structure or the resistance paths through contact openings/vias extending from the substrate to the first metal interconnect layer.

2. Description of the Related Art

Conventionally an integrated circuit structure may be constructed with local interconnects as shown in typical prior art FIG. 1. Typically, such local interconnects are formed in between raised portions of the integrated circuit devices, such as in between gate electrodes. Such local interconnects may be formed using the same conductive material as the filler material, e.g., tungsten, used to fill the contact openings which provide electrical connection to other portions of the integrated circuit device such as the source/drain regions. The local interconnects may also be formed using the same material used in forming the gate electrode, e.g., doped polysilicon. In either case, the material used for the local interconnect characteristically does not possess the same low resistance as the metal used for conventional metal interconnect layers, e.g., aluminum, but is more easily planarized by polishing techniques (particularly when tungsten is used as the local interconnect material). Since such local interconnects are conventionally formed at or about the same level as the gate electrode, they permit some low level electrical connections to be made between adjacent conductive areas at a level lower than the first metal interconnect level. However, since they are typically constructed at the same level as the gate electrodes and have no insulation below separating them from the underlying substrate, their use is limited to the interconnecting of adjacent conductive regions (they cannot bridge over conductive regions) and hence they are referred to as "local interconnects".

FIG. 1 shows a typical prior art integrated circuit structure with a local interconnect formed thereon. In the structure illustrated in FIG. 1, a semiconductor substrate 2 may be provided, by way of example, with several MOS transistors constructed thereon which are electrically isolated from one another by field oxide 6a, and from other devices in substrate 2 by field oxide 6b and 6c. The MOS devices respectively comprise source/drain regions 10 and 12 with a gate electrode 14 therebetween; and source/drain regions 20 and 22 with a gate electrode 24 therebetween. A first dielectric layer 30, formed of a dielectric material such as silicon oxide (SiO$_2$) and having a thickness of from about 3500 Å to about 5000 Å (after planarization), is deposited over this structure and then planarized back to about the level of gate electrodes 14 and 24, e.g., by an etch step or a chemical mechanical polishing process.

Filled contact openings 32 and 34 are then respectively formed through dielectric layer 30 down to underlying source/drain regions 10 and. 22 and then filled with a metal such as tungsten. At the same time, a portion of dielectric layer 30 is etched down to the level of source/drain regions 12 and 20 and field oxide 6b, and then filled with tungsten, to form filled opening 36 which comprises a local interconnect to electrically connect source/drain region 12 with source/drain region 20. Thus, when contact openings 32 and 34 are filled with a conductive material 44, such as tungsten metal, opening 36 is also filled at the same time with the same conductive material, thereby forming local interconnect 36 to electrically interconnect adjacent source/drain regions 12 and 20 together.

After formation of the first level of filled contact openings/vias and the local interconnects, a second dielectric layer 50 (which may also comprise SiO$_2$ and which may also have a thickness of from about 3500 Å to about 5000 Å) is formed over the structure. A filled via 52 is then formed through dielectric layer 50 to and in registry with underlying filled contact opening 32 to provide electrical contact to source/drain region 10; a filled via 54 is formed through layer 50 to and in registry with gate electrode 14; a filled via 56 is formed through layer 50 to and in registry with gate electrode 24, and a filled via 58 is formed through layer 50 to and in registry with filled contact opening 34 to provide electrical contact to source/drain region 22. Filled vias 52, 54, 56, and 58 are also typically filled with tungsten. A first layer 60 of metal interconnects, illustrated as 60a–60c and typically comprising a metal more highly conductive than tungsten such as aluminum or copper, is then formed over dielectric layer 50 to provide respective electrical contact to filled vias 52, 54, 56, and 58 and to provide interconnections between these regions and other regions (not shown) on the integrated circuit structure.

In this prior art construction it will be readily apparent that first metal interconnect layer 60 can bridge over other underlying conductive regions, e.g., over local interconnect 36, because of the presence of underlying dielectric layer 50. However, it will be equally apparent from examination of FIG. 1, that while underlying local interconnect 36 does permit electrical interconnection between adjacent electrodes or conductive regions below the level of first metal interconnect layer 60, this electrical connection is called a "local interconnect" because only adjacent (or "local") conductive regions (diffusion regions) may be electrically connected together in this manner. This is because local interconnect 36 is formed directly over the surface of substrate 2, i,e, it does not have an underlying dielectric layer unlike first metal interconnect layer 60. This, of course, limits the usefulness of local interconnects.

However, despite the drawbacks of local interconnects, they do have useful functions, even though somewhat limited compared to conventional metal interconnect layers. For example, even when the tungsten material comprising the local interconnect is not deposited over substrate 2 in the same step used to fill contact openings, the contact openings and local interconnect openings may be cut through the dielectric layer at the same time. There are other advantages to forming such a local interconnect at the same level as the contact opening and using the same material as used to fill the contact opening.

For example, it will be noted that the sum of the heights of filled contact opening 32 and filled via 52 from source/ drain region 10 to first metal interconnect layer 60 (the combined thickness of dielectric layers 30 and 50) is approximately the same as it would have been had local interconnect 36 not been formed in the structure. That is, the construction of local interconnect 36 in dielectric layer 30 did not lengthen the resistive path through the tungsten filler material from source/drain region 10 to metal interconnect layer 60. Thus, where the use of local interconnects can sometimes eliminate the need for one layer of metal interconnects, the total resistive path through the filled tungsten contact openings/vias in the overall integrated circuit structure may, as a result, be shortened, thus lowering the total resistance in the structure and increasing its speed.

However, it would be even more advantageous if one could utilize local interconnects without limiting their use to only strapping or interconnecting adjacent conductive regions, i.e., if the local interconnect could bridge over conductive regions or other interconnects. An alternative construction, illustrated in FIG. 2, alters the construction of the local interconnect to permit it to bridge or cross over underlying conductive regions.

In FIG. 2, where like structures are shown with like numerals, dielectric layer 30' (which may also comprise $SiO_2$) is formed over the underlying MOS structures and then planarized back to a thickness which may be the same as the height of gate electrodes 14 and 24, e.g., from about 3500 Å to about 5000 Å, but preferably to a thickness slightly (about 500 Å to about 1000 Å) in excess of the height of gate electrodes 14 and 24 for a reason which will be explained below.

Similarly to the structure of FIG. 1, filled contact opening 32' is formed through dielectric layer 30' to underlying source/drain region 10 in substrate 2 and filled contact opening 34' is formed through dielectric layer 30' to source/drain region 22 in substrate 2. However, unlike the structure shown in FIG. 1, a filled contact opening 132 is formed through dielectric layer 30' to source/drain region 12 in substrate 2; and filled contact openings 134 and 136 are respectively formed through dielectric layer 30' to gate electrode 14 and gate electrode 24. In each case, the filled contact openings may be filled with tungsten, as in the previous embodiment described for FIG. 1.

After formation of filled contact openings 32', 34', 132, 134, and 136 in dielectric layer 30', further dielectric layer 50' (which may also comprise $SiO_2$ and which may have the same thickness range as layer 50) is formed over dielectric layer 30' and the filled contact openings herein. A filled via 52' is formed in dielectric layer 50' extending down to (and in registry with) underlying filled contact opening 32', a filled via 54' is formed in dielectric layer 50' down to (and in registry with) underlying filled contact opening 134 over gate electrode 14, and a filled via 58' is formed in dielectric layer 50' down to (and in registry with) underlying filled contact opening 34'.

However, in this embodiment, a local interconnect 156 is formed in second dielectric layer 50' over (and in registry with) underlying filled contact opening 132 and filled contact opening 136, thereby connecting together source/drain region 12 and gate electrode 24. Furthermore, unlike the previous embodiment of FIG. 1, local interconnect 156 in FIG. 2 is shown bridging source/drain region 20 (electrical contact can be made to source/drain region 20 at another non-illustrated point in the structure along an axis perpendicular to the plane of the figure). Thus, this embodiment now permits the flexibility of use of the local interconnect which is lacking in the structure of FIG. 1. Furthermore, when the thickness of first dielectric layer 30' exceeds the height of gate electrodes 14 and 24, local interconnect 156 can even bridge such raised gate electrodes.

Nevertheless, there is a drawback with the use of the FIG. 2 structure which, at least in part, negates the advantages of the FIG. 2 structure over the FIG. 1 structure. This disadvantage is illustrated in FIG. 2 by the formation of the first metal interconnect layer 60' directly over second dielectric layer 50' as shown. Thus, illustrated individual metal interconnects 60a'–60d' are formed directly above second dielectric layer 50'. This puts the undersurface of first metal interconnect 60b', for example, directly in contact with the upper surface of local interconnect 156. Those skilled in the art will readily appreciate that the drawback in FIG. 1 of placing local interconnect 36 directly above substrate 2 (so that conductive regions in substrate 2 cannot be bridged by the local interconnects) has now simply been transferred to the interface between the local interconnect layer and the first metal interconnect layer. That is, now the first layer of metal interconnects cannot bridge over the local interconnects. This is actually a more serious problem than the problem encountered in the structure of FIG. 1, since the first metal interconnect layer is conventionally a more crowded layer with many more interconnects than at the local interconnect level, and the inability of the first metal interconnect level to cross over underlying local interconnects is a disability which cannot and will not be tolerated by design (layout) engineers.

While it might seem to be obvious to simply add another dielectric layer to the FIG. 2 structure, between the local interconnect layer and the first metal interconnect layer, to solve the bridging problem, this, too, cannot be tolerated because the presence of another dielectric layer between the first metal interconnect and the substrate results in the need to provide another layer of tungsten-filled vias through this third dielectric layer, thus adding to the cost and complexity of the structure as well as, increasing the defect density.

Thus, it remains a desire and goal to provide an integrated circuit structure with local interconnects and a first metal interconnect layer wherein both the local interconnect layer and the first metal interconnect layer may be capable of bridging over underlying conductive region in the integrated circuit structure without, however, substantial addition to either the resistance or the capacitance of the structure.

SUMMARY OF THE INVENTION

Quite surprisingly, we have discovered that an integrated circuit structure may be provided with a local interconnect layer and a first metal interconnect layer which are both capable of bridging over underlying conductive regions. The structure comprises a first dielectric layer formed over the structure to a height or thickness equal to or preferably exceeding the height of the highest conductive regions of the underlying integrated circuit devices; a second dielectric layer formed above the first dielectric layer; one or more local interconnects formed in the second dielectric layer; a thin third dielectric layer formed over the second dielectric layer and the local interconnects therein, wherein the third dielectric layer has a thickness not exceeding about 2000 Å, and preferably ranging from about 1000 Å to about 1500 Å; and a first layer of metal interconnects formed over the thin third dielectric layer. Conventionally formed filled contact openings extend from the substrate through the first dielectric layer to either filled vias or a local interconnect in the second dielectric layer. The metal interconnects are electrically connected to either filled vias or one or more local interconnects in the second dielectric layer by filled shallow vias in the thin third dielectric layer. The shallow vias in the thin third dielectric layer are preferably filled with the same metals used to form the first layer of metal interconnects.

DETAILED DESCRIPTION OF THE INVENTION

Figure 1:
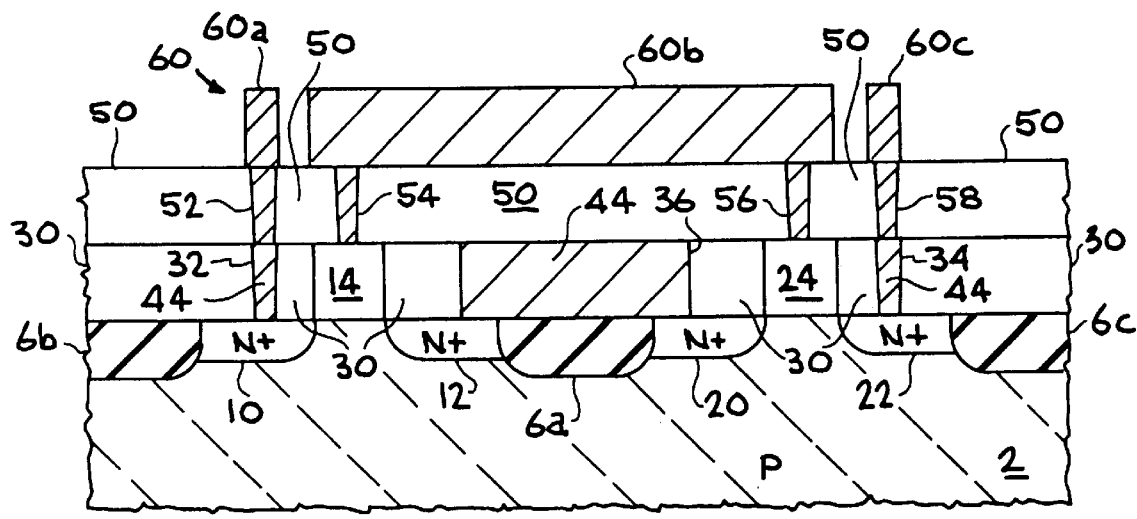
FIG. 1 is a fragmentary vertical cross-sectional view of a prior art integrated circuit structure showing conventional local interconnects formed over a semiconductor substrate and in contact with portions of the substrate, and a layer of metal interconnects formed over the local interconnects and separated therefrom by a dielectric layer through which filled vias or contact openings are formed.
Figure 2:
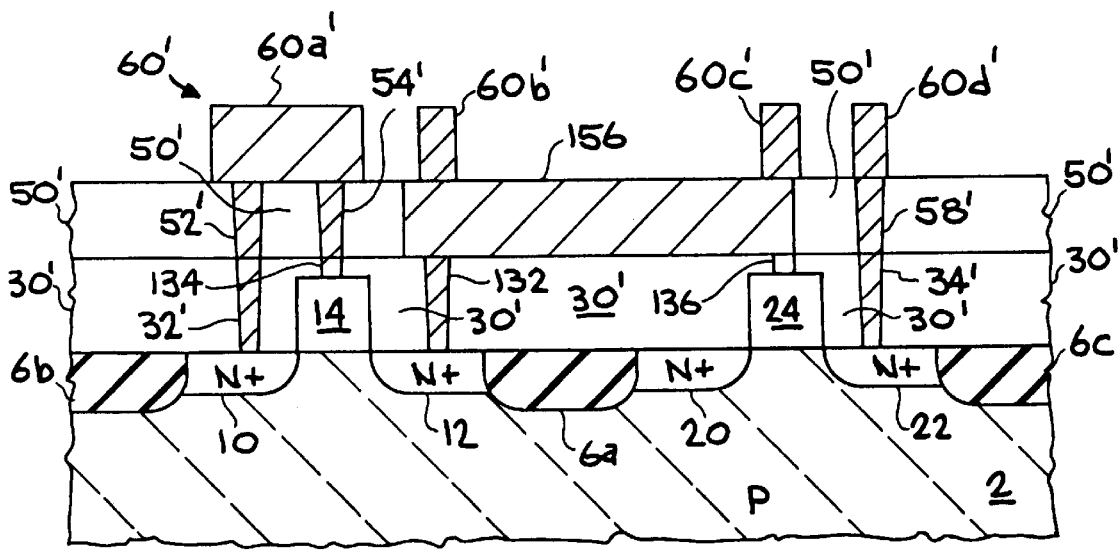
FIG. 2 is a fragmentary vertical cross-sectional view of another integrated circuit structure showing local interconnects formed over a first dielectric layer formed over the semiconductor substrate, with a layer of metal interconnects then formed directly over the local interconnect layer.

The invention comprises an integrated circuit structure provided with a local interconnect layer and a first metal interconnect layer which are both capable of bridging over underlying conductive regions. The structure comprises a first dielectric layer formed over the underlying integrated circuit structure to a height or thickness preferably exceeding the height of the highest conductive regions of the underlying integrated circuit devices, which usually will be the gate electrode; a second dielectric layer formed above the first dielectric layer; one or more local interconnects formed in the second dielectric layer; a thin third dielectric layer formed over the second dielectric layer and the local interconnects therein, wherein the third dielectric layer has a thickness not exceeding about 2000 Å, and preferably ranging from about 1000 Å to about 1500 Å; and a first layer of metal interconnects formed over the thin third dielectric layer. Conventionally formed filled contact openings extend from the substrate through the first dielectric layer to either filled vias or a local interconnect in the second dielectric layer. The metal interconnects are electrically connected to either filled vias or one or more local interconnects in the second dielectric layer by filled shallow vias in the third dielectric layer. The shallow vias in the thin third dielectric layer are preferably filled with the same materials and desirably at the same time as that used to form the first layer of metal interconnects.

Since the local interconnect in the preferred embodiment of the invention is not located at the same level as the gate electrode, for purposes of this invention the term "local interconnect" is intended to mean the first patterned layer of interconnects formed above the substrate and formed from a conductive material having a higher resistance than the higher levels of patterned metal interconnect layers.

By use of the term "thin dielectric" herein is meant a dielectric material not exceeding about 2000 Å in thickness and preferably having a thickness ranging from about 1000 Å to about 1500 Å, although even thinner dielectric layers may be used in some instances. This is in contrast to the conventional dielectric layer between local interconnects and metal interconnects (or between layers of metal interconnects) having a thickness usually ranging from about 7000 Å to about 10,000 Å.

What is surprising about the invention is the discovery that a thin dielectric layer could be used to separate the local interconnect layer from the first metal interconnect layer without unduly increasing the overall capacitance of the structure, and without unduly increasing the resistance path from portions of the underlying integrated circuit devices to the metal interconnects.

First of all, with respect to the resistance, the use of a thin dielectric layer between the local interconnect layer and the first metal interconnect layer means that the height or thickness of a via through this thin dielectric layer does not unduly increase the resistance because of the short additional path of the via through the thin dielectric layer. However, what was further surprising about this was that by shortening the height of the via (without changing the diameter), the aspect ratio of the via was lowered, thus making it possible to eliminate the use of the high resistance tungsten metal filler (which is normally used to fill vias with high aspect ratios because of the superior via-filling ability of tungsten). Instead, the shallow vias can be filled at the same time (and with the same low resistance material) as the blanket deposition of the metal layer over the thin dielectric layer, e.g., the aluminum or copper layer which will be patterned to form the metal interconnects. Since the shallow (low aspect ratio) via can be filled with the same low resistance metal used to form the metal interconnects, and since the via height is very short (1000 Å to 2000 Å compared to 7000 Å to 10,000 Å), the resistance added to the circuit by the presence of the thin dielectric of the invention is negligible.

Secondly, and perhaps even more surprising because of its subtlety, is the negligible effect of the thin dielectric of the invention on the overall capacitance of the integrated circuit structure. In previous integrated circuit structures where the aspect ratio (height/width) of contact openings and vias was at 2:1 or less, the width of the interconnects or lines was sufficiently large so that the vertical capacitance, i.e., the capacitance through the thickness of the dielectric layer from one level of interconnect to the next level, contributed most of the capacitance of the circuit, thus resulting in the need and use of thick dielectric layers. However, as the aspect ratios increased and the line widths decreased the vertical component of the capacitance decreased. At the same time, the horizontal spacing between vias and between lines (as well as between vias and lines) shrank sufficiently so that the horizontal capacitance between adjacent conductive surfaces, such as between adjacent lines, has increased, thereby becoming a major contributor to the overall capacitance of the circuitry. The thickness of the dielectric layers, however, has not changed, despite such changes in aspect ratios and linewidths, because at higher metal interconnect layer levels, the length of the lines, and the number of crossings of lines, is such that vertical capacitance still is a major contributor to capacitance.

Thus, it was surprisingly realized that at least the first dielectric layer separating the local interconnect layer and the first metal interconnect layer could be made considerably thinner without unduly increasing the overall capacitance of the circuitry, because of the greater contribution of the horizontal capacitance to the overall capacitance of the circuitry (at least at such local interconnect/first metal interconnect levels).

It should be noted that while the invention is principally directed to the local interconnect and first metal interconnect levels, and the separation of these two levels by a special thin dielectric layer, there may be some instances where the provision of such a thin dielectric layer between the first and second metal interconnect layers may also be appropriate, depending upon the density of the interconnects and the number of crossovers between such levels which could, if too high, add an unacceptable amount of capacitance to the integrated circuit structure if such a thin dielectric layer was used. Thus, under appropriate circumstances where the additional vertical capacitance will be insignificant, it is within the scope of the invention to also utilize the thin dielectric layer of the invention between the first and second levels of metal interconnects.

In any event, the utility of the invention is particularly directed toward the lowest levels of interconnects such as the local interconnect and first metal interconnect levels (and possibly between the first and second metal interconnect levels), where the length of the lines is short, to thereby minimize added vertical capacitance. By "short", with respect to line and interconnect length, is meant not more than about 50 microns in length, preferably not more than about 20 microns, more preferably about 10 microns, and most preferably not more than about 5 microns in length.

Figure 3:
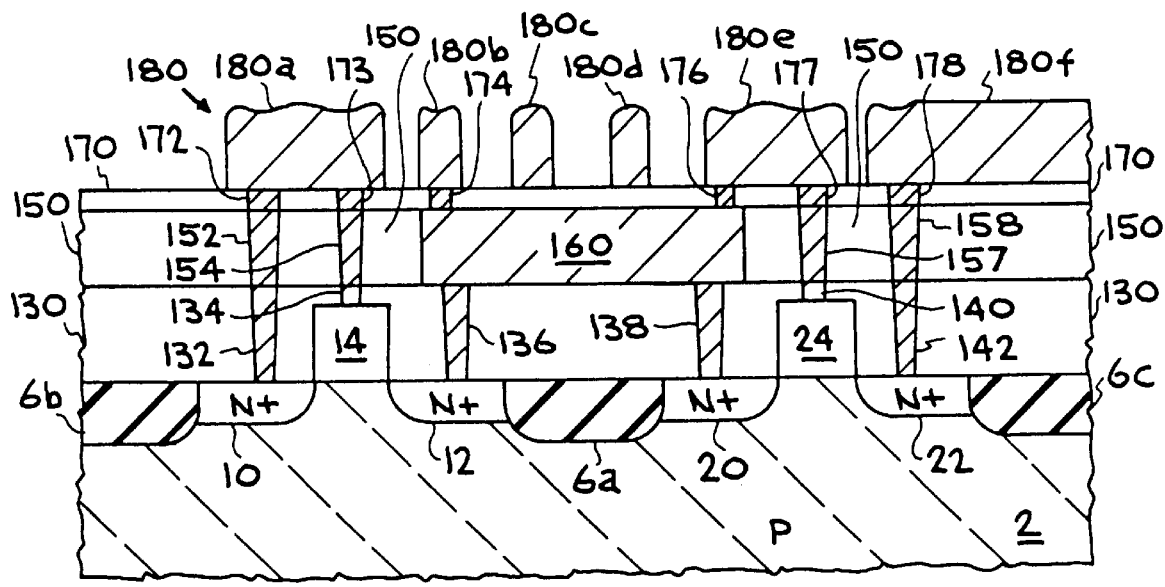
FIG. 3 is a fragmentary vertical cross-sectional view of the integrated circuit structure of the invention showing local interconnects formed over a first dielectric layer formed over the semiconductor substrate, with a thin dielectric layer formed over the local interconnects to separate them from a layer of metal interconnects formed over the thin dielectric layer.
Figure 4:
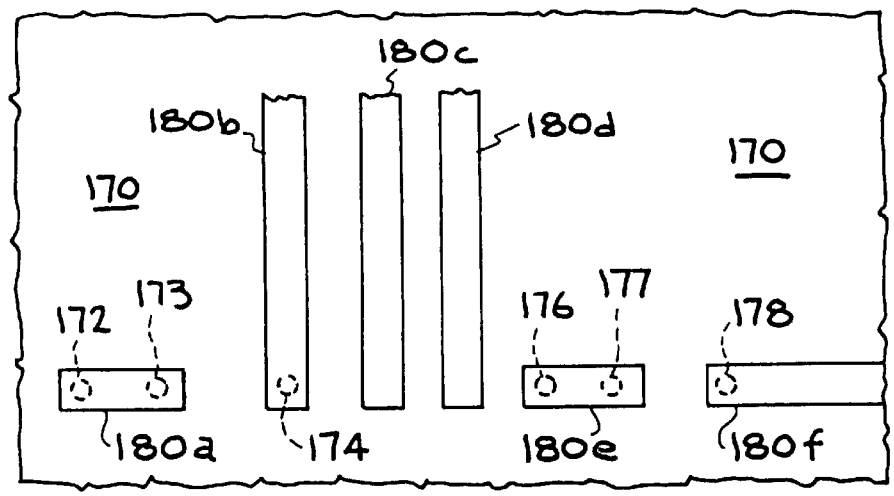
FIG. 4 is a fragmentary top view of the structure of FIG. 3.

Turning now to FIGS. 3 and 4, the structure and process of the invention is illustrated. As in the prior art structure illustrated in FIG. 1, a semiconductor substrate 2 may be provided, by way of example, with several MOS transistors constructed thereon which are electrically isolated from one another by field oxide 6a, and from other devices in substrate 2 by field oxide 6b and 6c. The illustrated MOS devices respectively comprise source/drain regions 10 and 12 with a gate electrode 14 therebetween; and source/drain regions 20 and 22 with a gate electrode 24 therebetween.

In accordance with the invention, a first dielectric layer 130, formed of a dielectric material such as silicon oxide ($SiO_2$), is deposited over this structure and then planarized back, by an etch step or a chemical mechanical polishing process, to a level which is preferable slightly higher that gate electrodes 14 and 24 (which range in height from about 3500 Å to about 5000 Å). By slightly higher is meant from about 500 Å to about 1000 Å higher than the top of gate electrodes 14 and 24. Contact openings 132, 134, 136, 138, 140, and 142 are then cut through dielectric layer and filled with a conductive metal such as tungsten capable of filling a contact opening having a diameter of, for example, approximately 0.25 micrometers ($\mu$m).

The surface of the structure may be again planarized at this time, for example, by chemical mechanical polishing (CMP), to remove any of the contact opening filler material from the surface of dielectric layer 130. A second dielectric layer 150 is then formed over dielectric layer 130 to a thickness which, when added to the thickness of dielectric layer 130, will equal a total thickness of both dielectric layers of from about 7000 Å to about 10,000 Å.

Openings are then cut through dielectric layer 150 for the formation of vias to the previously described underlying filled contact openings, as well as for formation of local interconnects. The filled vias, such as illustrated filled vias 152, 154, 157, and 158, and the local interconnects, such as illustrated local interconnect 160, are then formed by filling the openings with a conductive material (such as tungsten) capable of filling vias having a diameter of, for example, approximately 0.25 $\mu$m. The structure may then be subject to a further planarization, such as a dry etch step or a chemical mechanical polishing step to remove the filler material form the surface of dielectric material 150.

In accordance with the invention, a third dielectric layer 170, comprising a thin dielectric layer, is formed over dielectric layer 150 after the formation of the filled vias, e.g., filled vias 152–158, and the local interconnects, e.g., local interconnect 160. Thin third dielectric layer 170 is formed over dielectric layer 150 to a thickness not exceeding about 2000 Å, and preferably ranging from about 1000 Å to about 1500 Å, although in some instances, dielectric layer 170 may be as thin as 500 Å. This dielectric layer may again comprise silicon oxide ($SiO_2$). Alternatively, thin dielectric layer 170 may comprise a material having an even lower dielectric constant than silicon oxide (i.e., lower than 3.8) to further reduce any capacitance added to the integrated circuit structure by the presence of third dielectric layer 170. Examples of such dielectric materials having dielectric constants less than 3.5 include fluorinated perylene, fluorinated $SiO_2$, and hydrogen silsesquioxane. Lower dielectric constant materials for use in the formation of thin dielectric layer 170 can also be formed from modified silicon oxide, as described and claimed in U.S. Pat. Nos. 5,393,712, 5,470, 801, and 5,598,026, all assigned to the assignee of this invention.

After formation of thin dielectric layer 170, vias are cut through layer 170 to the previously described underlying filled vias and local interconnects as desired. Thus, as illustrated in FIG. 3, vias 172, 173, 174 and 176, 177, 178 are cut through dielectric layer 170 to respectively connect with underlying filled vias 152 and 154, local interconnect 160, and filled vias 157 and 158.

It should be pointed out that the diameters of vias 172, 173, 174 and 176, 177, 178 are preferably the same as that of previously formed vias 152 et al., i.e., about 0.25 $\mu$m. In view of the relative difference in thickness between dielectric layer 170 and underlying dielectric layer 150, forming vias through layer 170 with the same diameter as the vias through layer 150 results in the formation of vias in layer 170 of much smaller aspect ratios (height/width) than the vias previously formed in layer 150. As a result of this, it has been found that, at least in some instances, the need for a separate step to fill the shallow vias formed in thin dielectric layer 170 with special filler material, e.g., tungsten, can be eliminated. That is, the shallow low aspect ratio vias cut through dielectric layer 170 may be filled during the subsequent blanket deposit of a patternable metal, such as aluminum, over dielectric layer 170 for the formation of the first metal interconnect layer.

It should also be noted that an added bonus of the practice of the invention is that the photoresist etch mask used to form the shallow vias through thin insulation layer 170 need not be a thick photoresist layer, since the via-etching step is very short (due to the thinness of dielectric layer 170) and therefore less of the photoresist mask will be eroded. The use of a thinner photoresist mask, in turn, will increase the resolution and accuracy of pattern size and generally improve the masking process.

The filling of vias 172, 173, 174 and 176, 177, 178 with the same metal used to form the first layer of metal interconnects is advantageous from the standpoint of the lower resistance of metal interconnect material, such as aluminum (or copper), compared to conventional via filler materials, such as tungsten (which are selected for their via-filling capabilities, not their low resistance). This feature, coupled with the shortened length (height) of the vias (due to the thinness of dielectric layer 170), results in a minimizing of the resistance added to the integrated circuit structure by the addition of thin dielectric layer 170.

Still referring to FIG. 3, a blanket layer of a patternable metal, such as aluminum, is deposited over dielectric layer 170 and into (and filling) vias 172, 173, 174 and 176, 177, 178, in preparation for the formation of metal interconnects 180a–180f. After deposition of the blanket layer of metal, such as aluminum, and the filling of the vias in dielectric layer 170, the metal layer is patterned, as shown in FIGS. 3 and 4, using a suitable photoresist mask and an anisotropic etch system, such as a chlorine plasma etch for aluminum. It should be observed here that while the anisotropic etch will normally be designed to stop at dielectric layer 170, overetching into layer 170, or even entirely through layer 170 to underlying dielectric layer 150, is harmless, since a further dielectric layer will be deposited over and in between metal interconnects 180a–180f (arid over any exposed surfaces of dielectric layers 150 and 170 in between the metal interconnects) after the formation of the metal interconnects.

Figure 5:
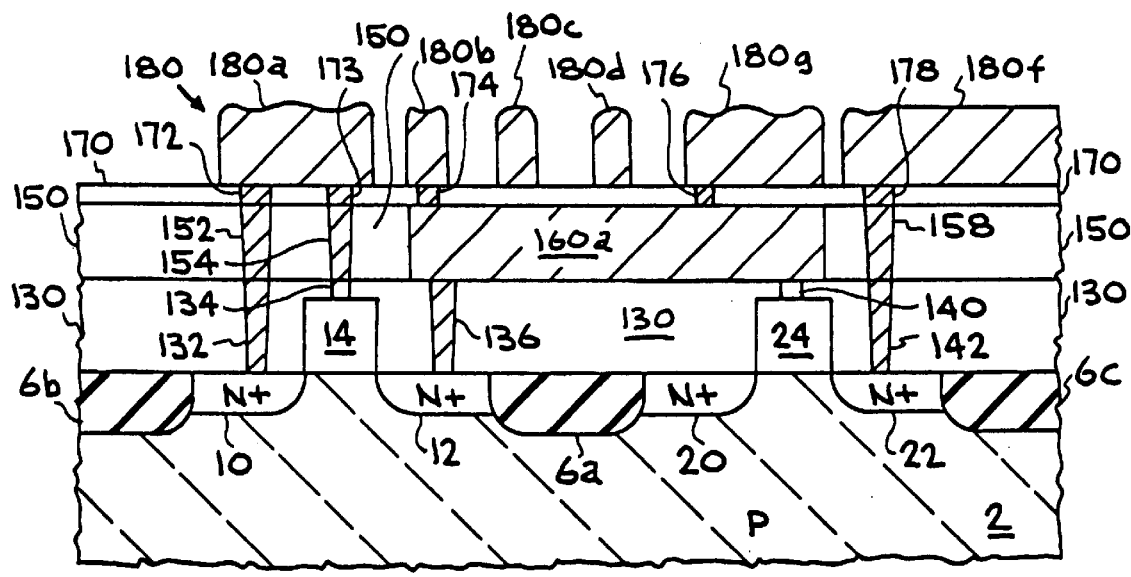
FIG. 5 is a fragmentary vertical cross-sectional view of the integrated circuit structure of the invention similar to FIG. 3 showing local interconnects formed over a first dielectric layer formed over the semiconductor substrate, with one of the local interconnects bridging over an underlying conductive region.

Turning now to FIG. 5, local interconnect 160 of FIG. 3 has been replaced by local interconnect 160a which is electrically connected to source/drain 12 through filled contact opening 136 and to gate electrode 24 through filled contact opening 140. In accordance with the invention, local interconnect 160a is shown bridging over source/drain 20. Local interconnect 160a is shown connected to metal interconnect 180b by filled via 174 and to metal interconnect 180g by filled via 176.

It will be noted in FIG. 3 that the filled vias formed in layer 150 and the local interconnects are in registry and in contact with the respective underlying filled contact openings to thereby complete the respective electrical paths, for example, from source/drain region 10 to metal interconnect 180a through filled contact opening 132, filled via 152, and filled via 172.

Alternatively, if copper is used to form metal interconnects 180a–180f, a thin layer of copper may be first deposited over dielectric layer 170 to fill vias 172, 173, 174 and 176, 177, 178 with copper, followed by a chemical mechanical polishing step to remove any copper from the surface of layer 170. A fourth dielectric layer may then be deposited over layer 170 and etched to form trenches through the entire thickness of the fourth dielectric layer, the trenches corresponding to the desired pattern of metal interconnects, thereby exposing the copper-filled vias. A layer of copper is then deposited over the fourth dielectric layer and in the trenches, thereby making contact with the copper-filled vias. The structure is then subject to a further chemical mechanical polishing to remove all copper on the surface of the fourth dielectric layer, leaving the desired pattern of copper interconnects in the trenches.

Regardless of whether copper or aluminum (or any other metal of equivalent low resistance) is used to form the metal interconnects, the result is an integrated circuit structure having a local interconnect level capable of bridging conductive regions in the substrate, and a first metal interconnect level separated from the local interconnect level by a thin dielectric layer. The thin dielectric layer, having a thickness not exceeding about 2000 Å, and preferably having a thickness range of from about 1000 Å to about 1500 Å, does not add significant resistance or capacitance to the circuit.

The added resistance is minimal because of the reduced path length of the additional via through the thin dielectric layer and the reduced aspect ratio of the vias through the thin dielectric layer which makes possible the filling of the vias in the thin dielectric layer with the same low resistance metal used to form the metal interconnect level.

The added capacitance is minimal because of the low density of crossover lines between the local interconnect/first metal interconnect levels and the close horizontal spacing between adjacent vias and/or adjacent lines which provides the majority of the capacitance as horizontal components, and reduces the significance of vertical capacitance components.

Having thus described the invention what is claimed is:

1. In a process for forming an integrated circuit structure on a semiconductor substrate with a local interconnect layer separated from said substrate by a first dielectric layer; and a first metal interconnect layer over said semiconductor substrate, said first metal interconnect layer separated from said local interconnect layer only by a thin dielectric layer, the improvement which comprises:

a. forming, between said local interconnect layer and said substrate, a first dielectric layer; and b. forming over said local interconnect layer said thin dielectric layer having a thickness not exceeding about 2000 Å and a dielectric constant of less than 3.8 to separate said local interconnect layer from said first metal interconnect layer;

whereby at least one first conductive region on said substrate is bridged by a local interconnect used to electrically connect second conductive regions in said substrate.

2. The process for forming an integrated circuit structure of claim 1 wherein said step of forming a thin dielectric layer further comprises forming a dielectric layer having a thickness ranging from about 1000 Å to about 2000 Å.

3. The process for forming an integrated circuit structure of claim 1 wherein said step of forming a thin dielectric layer further comprises forming a dielectric layer having a thickness ranging from about 1000 Å to about 1500 Å.

4. The process for forming an integrated circuit structure of claim 1 including the further steps of forming shallow vias in said thin dielectric layer, and filling said shallow vias with the same metal used to form said first metal interconnect layer.

5. A process for forming an integrated circuit structure comprising:

a) providing a semiconductor substrate having two or more integrated circuit devices constructed on and in said substrate;

b) forming a first dielectric layer over said substrate and said integrated circuit devices;

c) forming filled contact openings in said first dielectric layer extending down through said first dielectric layer to said integrated circuit devices;

d) forming a second dielectric layer over said first dielectric layer;

e) forming filled vias and one or more local interconnects in said second dielectric layer extending down to said filled contact openings;

f) forming a thin dielectric layer having a thickness rang from about 500 Angstroms to about 2000 Angstroms, said thin dielectric layer formed:
  i) directly over and in contact with said second dielectric layer,
  ii) over said filled vias, and
  iii) over said one or more local interconnects in said second dielectric layer;
g) forming shallow filled vias in said thin dielectric layer; and
h) forming a patterned metal interconnect layer over and in contact with said thin dielectric layer and in contact with said filled shallow vias in said thin dielectric layer.

6. The process for forming an integrated circuit structure of claim 5 further comprising the step of filling said shallow vias in said thin dielectric layer with the same metal used to form said patterned metal interconnect layer.

* * * * *